(12) United States Patent
Luo

(10) Patent No.: US 12,107,094 B2
(45) Date of Patent: Oct. 1, 2024

(54) ARRAY SUBSTRATE AND DISPLAY PANEL

(71) Applicant: WUHAN CHINA STAR OPTOELECTRONICS TECHNOLOGY CO., LTD., Wuhan (CN)

(72) Inventor: Chengzhi Luo, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 679 days.

(21) Appl. No.: 17/280,913

(22) PCT Filed: Feb. 5, 2021

(86) PCT No.: PCT/CN2021/075585
§ 371 (c)(1),
(2) Date: Mar. 28, 2021

(87) PCT Pub. No.: WO2022/156010
PCT Pub. Date: Jul. 28, 2022

(65) Prior Publication Data
US 2023/0098341 A1 Mar. 30, 2023

(30) Foreign Application Priority Data
Jan. 22, 2021 (CN) ............................ 20210088265.1

(51) Int. Cl.
*G02F 1/1368* (2006.01)
*G02F 1/1362* (2006.01)
*H01L 27/12* (2006.01)
(52) U.S. Cl.
CPC .... *H01L 27/1251* (2013.01); *G02F 1/136209* (2013.01); *G02F 1/136218* (2021.01);
(Continued)

(58) Field of Classification Search
CPC ...................................................... G02F 1/1368
See application file for complete search history.

(56) References Cited

U.S. PATENT DOCUMENTS

| 10,962,850 | B1 * | 3/2021 | Yang | ................. G02F 1/136209 |
| 2016/0011447 | A1 * | 1/2016 | Choi | ..................... G02F 1/1339 |
| | | | | 438/30 |

(Continued)

FOREIGN PATENT DOCUMENTS

| CN | 103809320 A | 5/2014 |
| CN | 105070726 A | 11/2015 |

(Continued)

OTHER PUBLICATIONS

Chinese Office Action in corresponding Chinese Patent Application No. 202110088265.1 dated Jul. 4, 2022, pp. 1-10.

(Continued)

*Primary Examiner* — Sang V Nguyen
(74) *Attorney, Agent, or Firm* — PV IP PC; Wei Te Chung

(57) ABSTRACT

An array substrate and a display panel are provided. The array substrate includes a plurality of recess-shaped light-shielding patterns. An oxide semiconductor layer is correspondingly formed in a recess of one of the light-shielding patterns. In comparison with increasing a plane area for improving light-shielding performance of the light-shielding patterns, an area of an orthographic projection of the recess-shaped light-shielding patterns on the array substrate is smaller. Therefore, an area of a light-transmitting region of the array substrate is greater, thereby increasing an aperture of the array substrate.

17 Claims, 12 Drawing Sheets

(52) U.S. Cl.
CPC ........ *G02F 1/1368* (2013.01); *H01L 27/1225* (2013.01); *H01L 27/1248* (2013.01); *G02F 2202/104* (2013.01)

(56) References Cited

U.S. PATENT DOCUMENTS

| | | | | |
|---|---|---|---|---|
| 2016/0307936 | A1* | 10/2016 | Shin | ............... H01L 27/1222 |
| 2017/0092198 | A1* | 3/2017 | Ryu | ............... G09G 3/3275 |
| 2021/0167155 | A1* | 6/2021 | Xu | ............... H01L 29/7869 |

FOREIGN PATENT DOCUMENTS

| | | | | |
|---|---|---|---|---|
| CN | 107170829 | A | 9/2017 | |
| CN | 107507867 | A | 12/2017 | |
| CN | 107863354 | A | 3/2018 | |
| CN | 108695394 | A | 10/2018 | |
| CN | 108807549 | A | 11/2018 | |
| CN | 109427874 | A | 3/2019 | |
| CN | 109661729 | A | 4/2019 | |
| CN | 115020446 | * | 9/2022 | ............ H01L 21/77 |
| JP | H06334185 | A | 12/1994 | |
| JP | 2012069842 | A | 4/2012 | |
| KR | 20010038176 | A | 5/2001 | |

OTHER PUBLICATIONS

International Search Report in International application No. PCT/CN2021/075585, mailed on May 20, 2021.

Written Opinion of the International Searching Authority in International application No. PCT/CN2021/075585, mailed on May 20, 2021.

* cited by examiner

ARRAY SUBSTRATE AND DISPLAY PANEL

RELATED APPLICATIONS

This application is a National Phase of PCT Patent Application No. PCT/CN2021/075585 having international filing date of Feb. 5, 2021, which claims the benefit of priority of Chinese Patent Application No. 202110088265.1 filed on Jan. 22, 2021. The contents of the above applications are all incorporated by reference as if fully set forth herein in their entirety.

FIELD OF DISCLOSURE

The present disclosure relates to the field of display technologies, and in particular to an array substrate and a display panel.

BACKGROUND

With development of wearable device technologies and under a background that no significant breakthrough has been made in current battery technologies, people have higher and higher requirements for power consumption of display devices. Low temperature poly-silicon (LTPS) currently used in drive thin film transistors and switch thin film transistors is still a mainstream technology due to its low power consumption. However, due to a high carrier mobility of LTPS and a high leakage current, a low temperature polycrystalline oxide (LTPO) technology has emerged. The LTPO combines advantages of both LTPS and oxide, and can improve a response speed of a display device and reduce a power consumption of the display device.

FIG. 1 is a schematic diagram of a film structure of an array substrate using a low temperature polycrystalline oxide technology in the prior art. The array substrate includes a base 101, a buffer layer 102, a first gate insulating layer 103, an interlayer dielectric layer 104, a second gate insulating layer 105, a passivation protection layer 106, and a planarization layer 107 which are sequentially stacked and arranged. A plurality of gate drive thin film transistors 11 and a plurality of pixel drive thin film transistors 12 are also provided in the array substrate. Semiconductor layers of the gate drive thin film transistor 11 and the pixel drive thin film transistor 12 are polysilicon semiconductor layer 111 and oxide semiconductor layer 121, respectively. For the pixel drive thin film transistor 12 with a bottom gate structure, since the oxide semiconductor layer 121 is more sensitive to light and hydrogen, it is necessary to increase an area of the first gate 122 located at a bottom of the oxide semiconductor layer 121 to improve light-shielding performance FIG. 2 is a schematic plan view of the pixel drive thin film transistors 12 in the prior art. The first gate 122 and scan lines 14 are disposed on the same layer. A first source 123 and a first drain 124 are disposed on the same layer as data lines 15. In order to obtain better light-shielding performance, the first gate 122 needs to extend beyond an edge of the oxide semiconductor layer 121 by at least 3 μm. However, this will decrease an aperture of the array substrate. On the other hand, the second gate 112, the second source 113, and the second drain 114 of the gate drive thin film transistor 11 need to be insulated by an interlayer dielectric layer 115. A hydrogen content in the interlayer dielectric layer 115 is relatively high. During a formation of the oxide semiconductor layer 121, hydrogen in the interlayer dielectric layer 115 diffuses into the oxide semiconductor layer 121, causing electrical anomalies of the oxide semiconductor layer 121, which in turn causes stability of the pixel drive thin film transistors 12 to decrease.

Accordingly, the existing array substrate has a problem of low aperture due to increasing an area of the gate for improving the light-shielding performance. Therefore, it is necessary to provide an array substrate and a display panel to improve this defect.

SUMMARY OF DISCLOSURE

Embodiments of the present disclosure provide an array substrate, a manufacturing method thereof, and a display panel to solve the problem of the existing array substrate having low aperture due to increasing an area of the gate for improving the light-shielding performance.

An embodiment of the present disclosure provides an array substrate. The array substrate includes a plurality of thin film transistors arranged in an array. At least part of thin film transistors in the plurality of the thin film transistors each includes an oxide semiconductor layer.

The array substrate includes a plurality of light-shielding patterns in a recess shape. The oxide semiconductor layer is correspondingly formed in a recess of one of the light-shielding patterns.

According to an embodiment of the present disclosure, the array substrate includes a base substrate, a first insulating layer disposed on the base substrate, and a plurality of via holes formed on the first insulating layer. The light-shielding patterns are disposed in the via holes.

According to an embodiment of the present disclosure, each of the light-shielding patterns includes a bottom light-shielding layer and a side light-shielding layer, the bottom light-shielding layer extends flatly and is disposed on a bottom of one of the via holes, the side light-shielding layer is formed by extending the bottom light-shielding layer toward a side of the first insulating layer away from the base substrate, and the side light-shielding layer and the bottom light-shielding layer form an included angle.

According to an embodiment of the present disclosure, the included angle formed by the side light-shielding layer and the bottom light-shielding layer is a right angle or an obtuse angle.

According to an embodiment of the present disclosure, a degree of the included angle is greater than 90° and less than or equal to 140°.

According to an embodiment of the present disclosure, a distance between a top of the side light-shielding layer and the bottom light-shielding layer is greater than a distance between a side of the oxide semiconductor layer away from the base substrate and the bottom light-shielding layer.

According to an embodiment of the present disclosure, an orthographic projection of one of the light-shielding patterns on the base substrate covers an orthographic projection of the oxide semiconductor layer on the base substrate.

According to an embodiment of the present disclosure, the plurality of the thin film transistors include a first thin film transistor, an active layer of the first thin film transistor is an oxide semiconductor layer, one of the light-shielding patterns is a gate of the first thin film transistor, and the first thin film transistor is formed in one of the via holes.

According to an embodiment of the present disclosure, the array substrate includes a second insulating layer covering the first insulating layer and the light-shielding patterns. The oxide semiconductor layer is disposed on a portion of the second insulating layer located in one of the via holes.

The first thin film transistor includes a first source and a first drain, the first source and the first drain are arranged on a side of the second insulating layer away from the first insulating layer, extend into one of the via holes, and are connected to the oxide semiconductor layer.

According to an embodiment of the present disclosure, the plurality of the thin film transistors include a plurality of second thin film transistors, an active layer of each of the second thin film transistors is a polysilicon semiconductor layer.

The first insulating layer includes a first gate insulating layer and an interlayer dielectric layer which are disposed on the base substrate in a layer-by-layer-like manner, the polysilicon semiconductor layer is disposed between the first gate insulating layer and the base substrate, and a gate of one of the second thin film transistors is disposed between the first gate insulating layer and the interlayer dielectric layer.

According to an embodiment of the present disclosure, the plurality of the via holes are formed on the interlayer dielectric layer, bottoms of the via holes extend toward the base substrate, and the second insulating layer covers the interlayer dielectric layer and the light-shielding patterns.

According to an embodiment of the present disclosure, each of the second thin film transistors includes a second source and a second drain, and the light-shielding patterns, the second source, and the second drain are made of a metal material in a same layer.

According to an embodiment of the present disclosure, each of the second thin film transistors includes a second source and a second drain, and the second source, the second drain, and the first source are made of a metal material in a same layer.

An embodiment of the present disclosure also provided a display panel. The display panel includes an array substrate. The array substrate includes a plurality of thin film transistors arranged in an array. At least part of thin film transistors in the plurality of the thin film transistors each includes an oxide semiconductor layer.

The array substrate includes a plurality of light-shielding patterns in a recess shape. The oxide semiconductor layer is correspondingly formed in a recess of one of the light-shielding patterns.

According to an embodiment of the present disclosure, the array substrate includes a base substrate, a first insulating layer disposed on the base substrate, and a plurality of via holes formed on the first insulating layer. The light-shielding patterns are disposed in the via holes.

According to an embodiment of the present disclosure, each of the light-shielding patterns includes a bottom light-shielding layer and a side light-shielding layer, the bottom light-shielding layer extends flatly and is disposed on a bottom of one of the via holes, the side light-shielding layer is formed by extending the bottom light-shielding layer toward a side of the first insulating layer away from the base substrate, and the side light-shielding layer and the bottom light-shielding layer form an included angle.

According to an embodiment of the present disclosure, the included angle formed by the side light-shielding layer and the bottom light-shielding layer is a right angle or an obtuse angle.

According to an embodiment of the present disclosure, a degree of the included angle is greater than 90° and less than or equal to 140°.

According to an embodiment of the present disclosure, a distance between a top of the side light-shielding layer and the bottom light-shielding layer is greater than a distance between a side of the oxide semiconductor layer away from the base substrate and the bottom light-shielding layer.

According to an embodiment of the present disclosure, an orthographic projection of one of the light-shielding patterns on the base substrate covers an orthographic projection of the oxide semiconductor layer on the base substrate.

An embodiment of the present disclosure also provides a manufacturing method of an array substrate, including:

providing a base substrate, and forming a first insulating layer on the base substrate;

forming a plurality of via holes on the first insulating layer;

forming a plurality of recess-shaped light-shielding patterns in the via holes;

forming a second insulating layer on a side of the first insulating layer away from the base substrate, where the second insulating layer covers the light-shielding patterns;

forming an oxide semiconductor layer in one of the via holes, where the oxide semiconductor layer is disposed in a recess of one of the light-shielding patterns; and forming a source and a drain on the second insulating layer.

Advantages of the embodiment of the present disclosure are as follow. The embodiments of the present disclosure provide the array substrate, the manufacturing method thereof, and the display panel. The array substrate includes the plurality of thin film transistors arranged in an array. At least part of thin film transistors in the plurality of the thin film transistors each includes the oxide semiconductor layer. The array substrate includes the plurality of recess-shaped light-shielding patterns. The oxide semiconductor layer is correspondingly formed in a recess of one of the light-shielding patterns. A bottom surface of the recess-shaped light-shielding pattern can block light irradiated from a light incident side of the array substrate to a bottom of the oxide semiconductor layer. A side surface of the recess-shaped light-shielding pattern can block light irradiated from the light incident side of the array substrate to a side surface of the oxide semiconductor layer. Thus, light-shielding performance of the light-shielding patterns can be improved by setting the light-shielding patterns as the recess shape. In comparison with increasing a plane area for improving light-shielding performance of the light-shielding patterns, an area of an orthographic projection of the recess-shaped light-shielding patterns on the array substrate is smaller. Therefore, an area of a light-transmitting region of the array substrate is greater, thereby increasing an aperture of the array substrate.

BRIEF DESCRIPTION OF DRAWINGS

In order to explain the embodiments or technical solutions in the present disclosure and prior art more clearly, the following will briefly introduce the drawings that need to be used in the description of the embodiments of the present disclosure or the prior art. Apparently, the drawings in the following description are only some of the disclosed embodiments. For those of ordinary skill in the art, other drawings can be obtained from these drawings without creative efforts.

DETAILED DESCRIPTION

Figure 1:
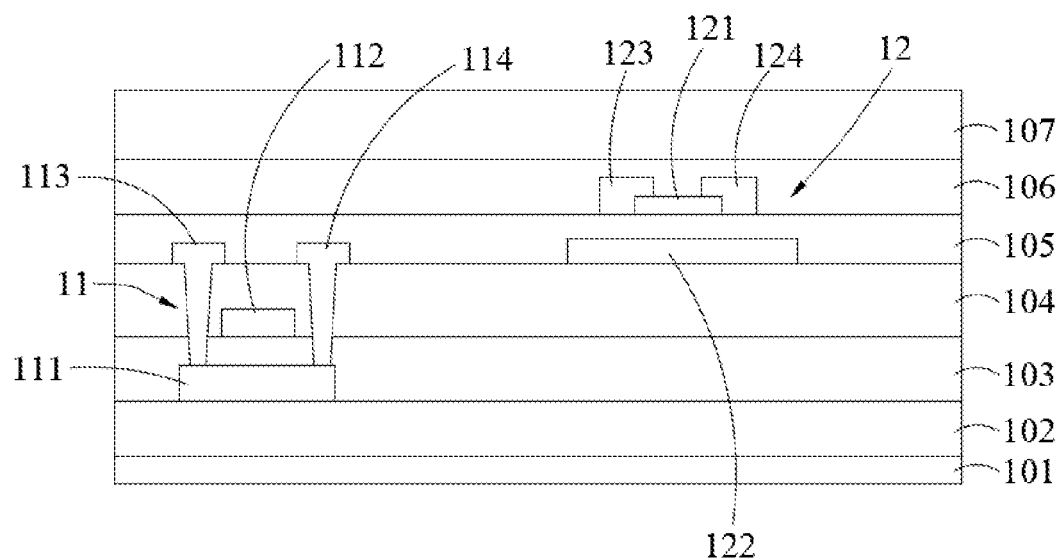
FIG. 1 is a schematic diagram of a film structure of an array substrate in the prior art.
Figure 2:
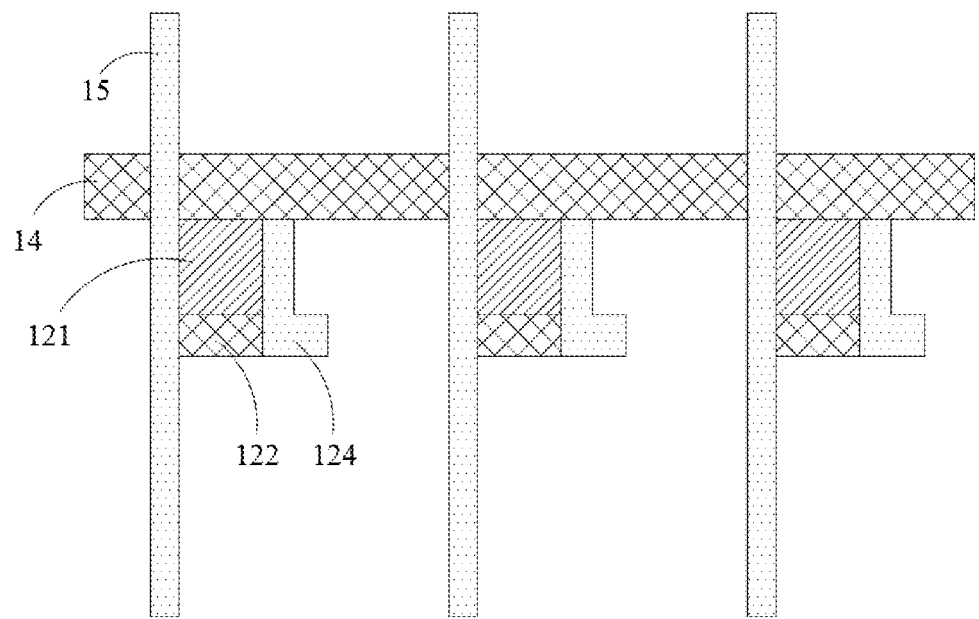
FIG. 2 is a schematic plan view of pixel drive thin film transistors in the prior art.

The description of the following embodiments refers to the accompanying drawings to illustrate specific embodiments that the present disclosure can be implemented. Directional terms mentioned in the present disclosure, such as upper, lower, front, back, left, right, inner, outer, side, etc., are only directions with reference to the accompanying drawings. Therefore, the directional terms are used to explain and understand the present disclosure, rather than to limit the present disclosure. In the drawings, units with similar structures are indicated by the same reference numerals.

The disclosure will be further described below in conjunction with the drawings and specific embodiments.

An embodiment of the present disclosure provides an array substrate, which will be described in detail below with reference to FIG. 3 to FIG. 7.

Figure 3:
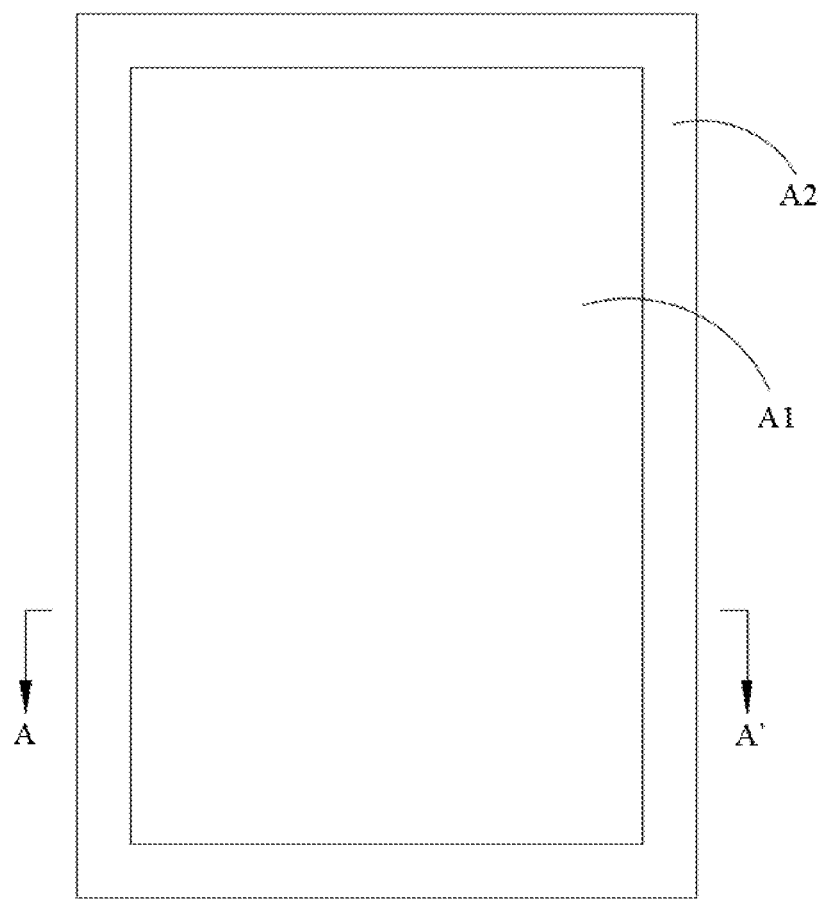
FIG. 3 is a schematic plan view of a display panel of an embodiment of the present disclosure.
Figure 4:
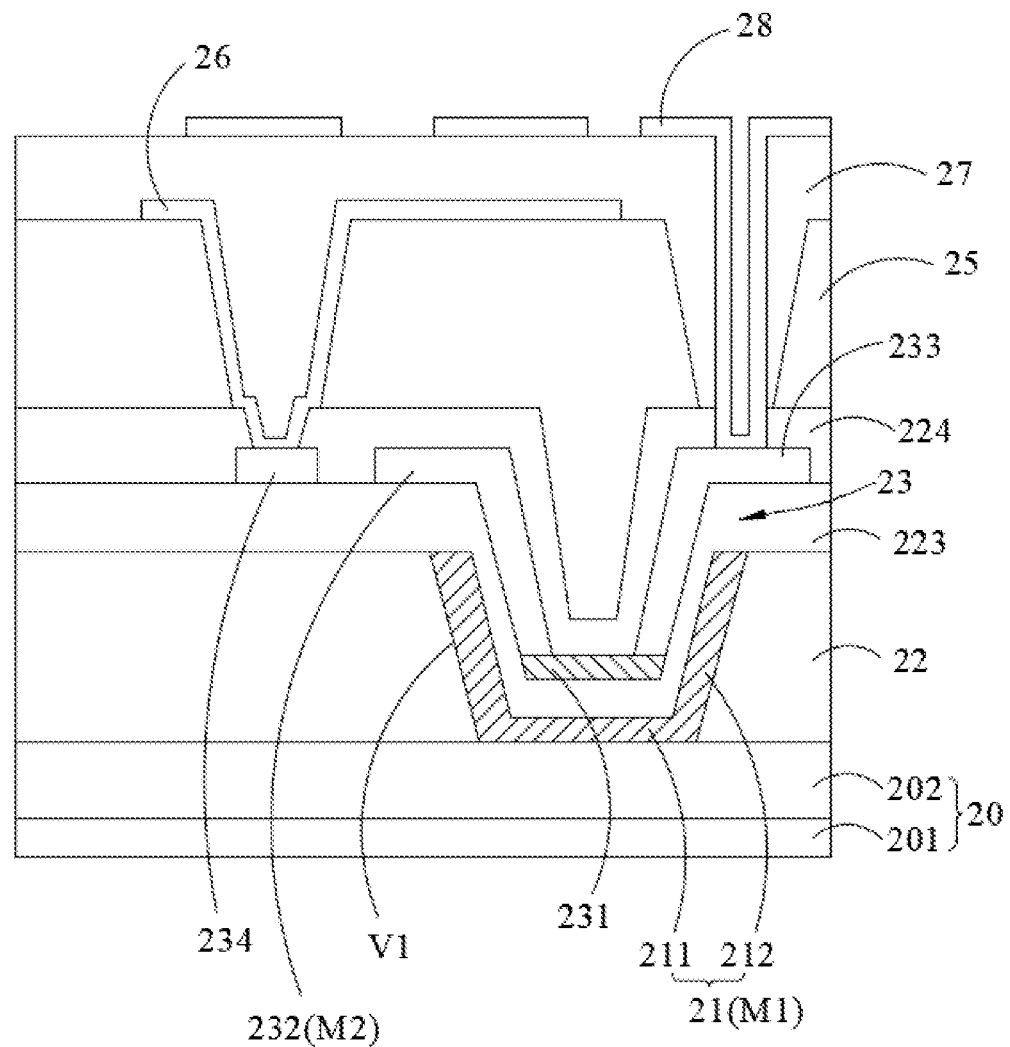
FIG. 4 is a cross-sectional view of an array substrate of a first embodiment of the present disclosure along an A-A' line.

FIG. 3 is a schematic plan view of a display panel of an embodiment of the present disclosure. FIG. 4 is a cross-sectional view of an array substrate of a first embodiment of the present disclosure along an A-A' line. The array substrate includes a plurality of thin film transistors arranged in an array. At least part of thin film transistors in the plurality of the thin film transistors each includes an oxide semiconductor layer 231. The array substrate includes a plurality of light-shielding patterns 21 in a recess shape. The oxide semiconductor layer 231 is correspondingly formed in a recess of one of the light-shielding patterns 21.

It should be noted that the array substrate, a liquid crystal layer, a color film substrate, and a backlight module can together form a liquid crystal display panel. The backlight module is disposed on a light incident side of the array substrate. The oxide semiconductor layer 231 is disposed on a side of the light-shielding pattern 21 away from the light incident side of the array substrate. When light emitted by the backlight module passes through the light incident side of the array substrate and enters an inside of the array substrate, a bottom and a side of the recess-shaped light-shielding pattern 21 can respectively block the light irradiated to a bottom and a side of the oxide semiconductor layer 231, thereby ensuring electrical performance of the oxide semiconductor layer 231.

In one embodiment, as shown in FIG. 4, the array substrate includes a base substrate 20 and a first insulating layer 22 disposed on the base substrate. The first insulating layer 22 is provided with a plurality of via holes V1. The light-shielding patterns 21 are arranged in the via holes V1.

Each of the light-shielding patterns 21 includes a bottom light-shielding layer 211 and a side light-shielding layer 212. The bottom light-shielding layer 211 extends flatly and is disposed on a bottom of the via hole V1. The side light-shielding layer 212 is formed by extending the bottom light-shielding layer 211 toward a side of the first insulating layer 22 away from the base substrate 20. The side light-shielding layer 212 and the bottom light-shielding layer 211 form an included angle.

Specifically, the base substrate 20 includes a substrate 201 and a buffer layer 202 which are formed in a layer-by-layer-like manner Preferably, the substrate 211 is a glass substrate. The array substrate includes a plurality of first thin film transistors 23. An active layer of the first thin film transistor 23 is the oxide semiconductor layer 231. The first thin film transistor 23 is formed in the via hole V1. The first thin film transistor 23 also includes a first source 232 and a first drain 233. The light-shielding patterns 21 are made of metal materials. The bottom light-shielding layer 211 can prevent light from being irradiated to the oxide semiconductor layer 231 from a bottom surface of the oxide semiconductor layer 231. The side light-shielding layer 212 can prevent light from being irradiated to the oxide semiconductor layer 231 from a side surface of the oxide semiconductor layer 231. Furthermore, the light-shielding pattern 21 can also serve as a gate of the first thin film transistor 23 to form an oxide thin film transistor with a bottom gate structure. A second insulating layer 223 is also disposed on the base substrate 20. The second insulating layer 223 covers the light-shielding pattern 21 and the first insulating layer 22. The oxide semiconductor layer 231 is disposed on a portion of the second insulating layer 223 located in the via hole V1. A first source 232 and a first drain 233 are disposed on a side of the second insulating layer 223 away from the base substrate 20, respectively extend into the via hole V1, and are connected to the oxide semiconductor layer 231 to form an ohmic contact.

The included angle formed by the side light-shielding layer 212 and the bottom light-shielding layer 211 is an obtuse angle. As shown in FIG. 4, sizes of the via hole V1 gradually increase from a side of the side light-shielding layer 212 close to the bottom light-shielding layer 211 to another side of the side light-shielding layer 212 away from the bottom light-shielding layer 211, so as to facilitate a subsequently formation of the second insulating layer 223, the oxide semiconductor layer 231, the first source 232, and the first drain 233. In this embodiment, by providing the side light-shielding layer 212 inclined to an outside, the light-shielding performance of the light-shielding patterns 21 to the oxide semiconductor layer 231 can be improved. In comparison with increasing a plane area of the light-shielding patterns for improving the light-shielding performance in the prior art, this embodiment adopts the recess-shaped light-shielding patterns 21. In a case of increasing the same area of the light-shielding patterns as the prior art, an area of an orthographic projection of the light-shielding patterns 21 on the base substrate 20 in this embodiment is smaller. The light passing through the array substrate is less blocked, so that the array substrate has a larger aperture.

A degree of the included angle formed by the side light-shielding layer 212 and the bottom light-shielding layer 211 ranges from 90° to 140°.

Specifically, in embodiments of the present disclosure, the included angle formed by the side light-shielding layer 212 and the bottom light-shielding layer 211 has a degree of 110°. In practical applications, other angle designs can be used according to requirements, not limited to the above-mentioned 110°, and may also be 100°, 130°, or 140°. In addition to the obtuse angle described above, the included angle formed by the side light-shielding layer 212 and the bottom light-shielding layer 211 may also be a right angle.

In one embodiment, as shown in FIG. 4, a distance between a top of the side light-shielding layer 212 and the bottom light-shielding layer 211 is greater than a distance between a side surface of the oxide semiconductor layer 231 away from the base substrate 20 and the bottom light-shielding layer 211. It is conceivable that when a height of the side light-shielding layer 212 is greater than a height of the bottom light-shielding layer 211, light irradiated to the oxide semiconductor layer 231 along a horizontal direction can also be blocked by the side light-shielding layer 212, thereby further improving the light-shielding performance of the light-shielding patterns 21. In this embodiment, the top of the side light-shielding layer 212 is flush with a surface of the first insulating layer 22 away from the base substrate 20. In some other embodiments, the top of the side light-shielding layer 212 may also be lower than the surface of the first insulating layer 22 away from the base substrate 20, or extend to the surface of the first insulating layer 22 away from the base substrate 20, which can also obtain the same light-shielding performance as the above-mentioned embodiment, which is not limited here.

Furthermore, an orthographic projection of the light-shielding pattern 21 on the base substrate 20 covers an orthographic projection of the oxide semiconductor layer 231 on the base substrate 20. It can be understood that the oxide semiconductor layer 231 is disposed on a side of the light-shielding pattern 21 away from the base substrate 20. When the orthographic projection of the light-shielding pattern 21 on the base substrate 20 covers the orthographic projection of the oxide semiconductor layer 231 on the base substrate 20, it can effectively block the light emitted by the backlight module to the oxide semiconductor layer 231 through the base substrate 20.

Figure 5:
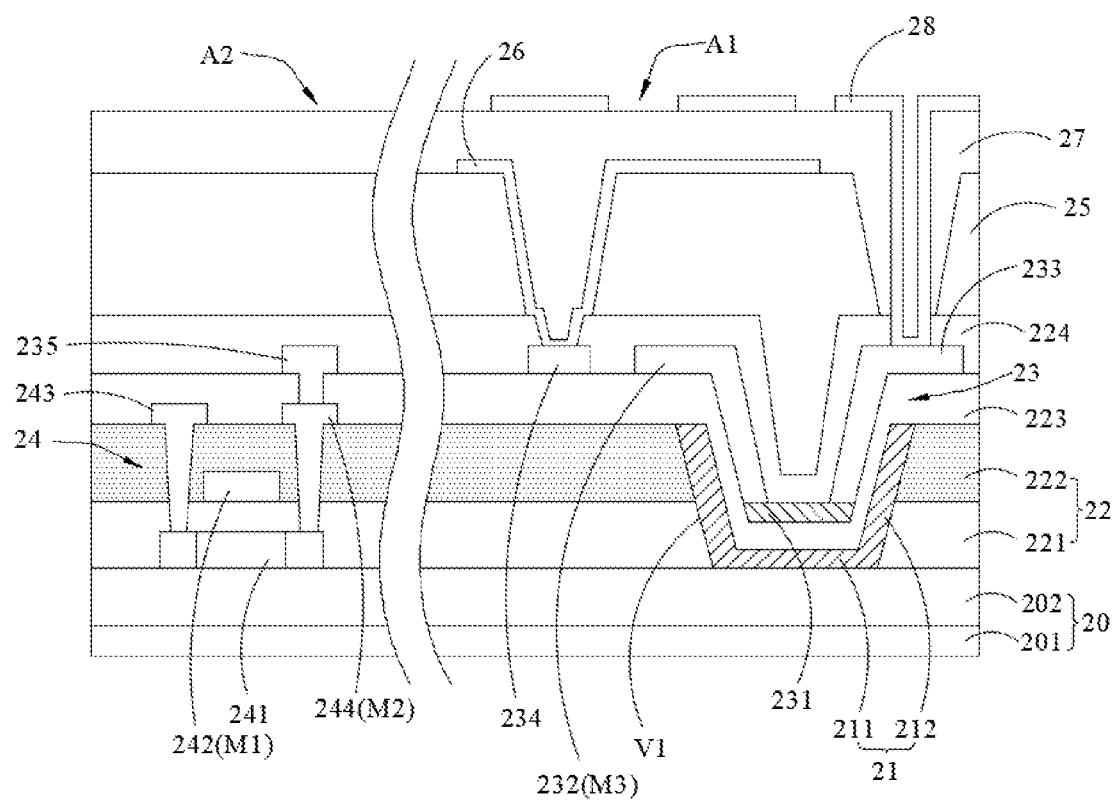
FIG. 5 is a cross-sectional view of an array substrate of a second embodiment of the present disclosure along an A-A' line.
Figure 6:
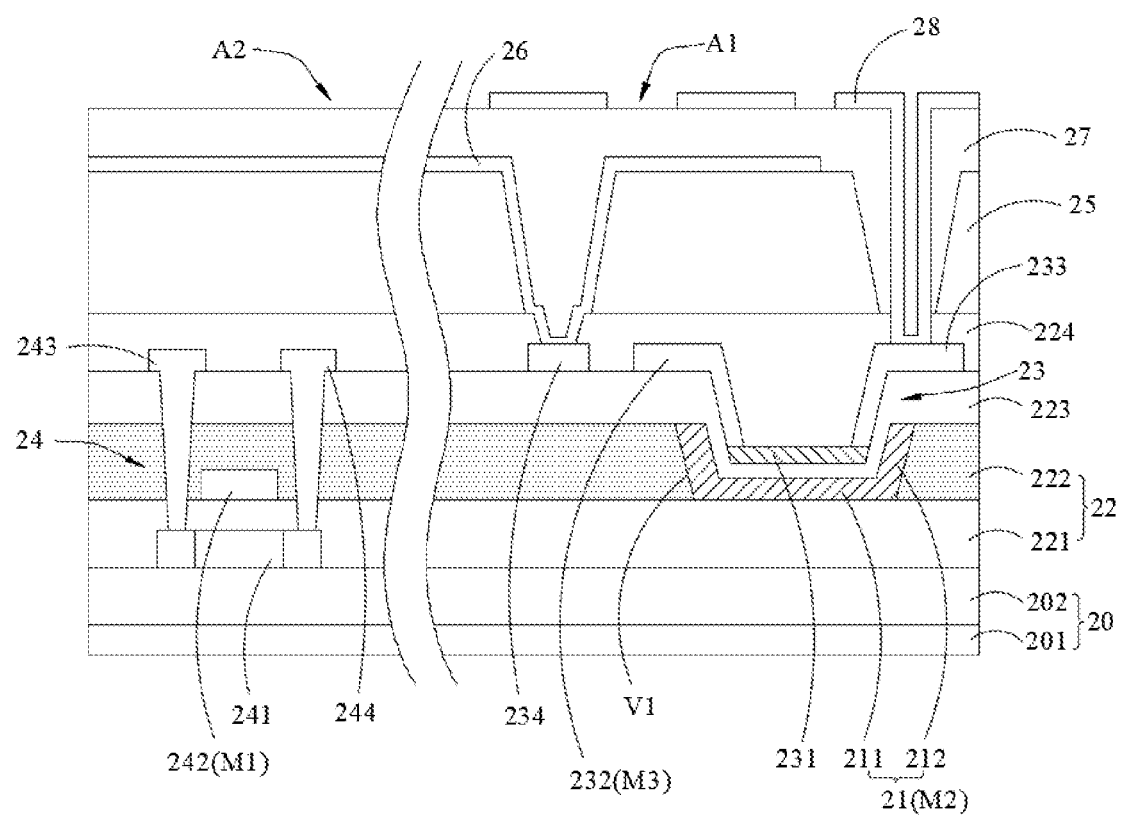
FIG. 6 is a cross-sectional view of an array substrate of a third embodiment of the present disclosure along an A-A' line.
Figure 7:
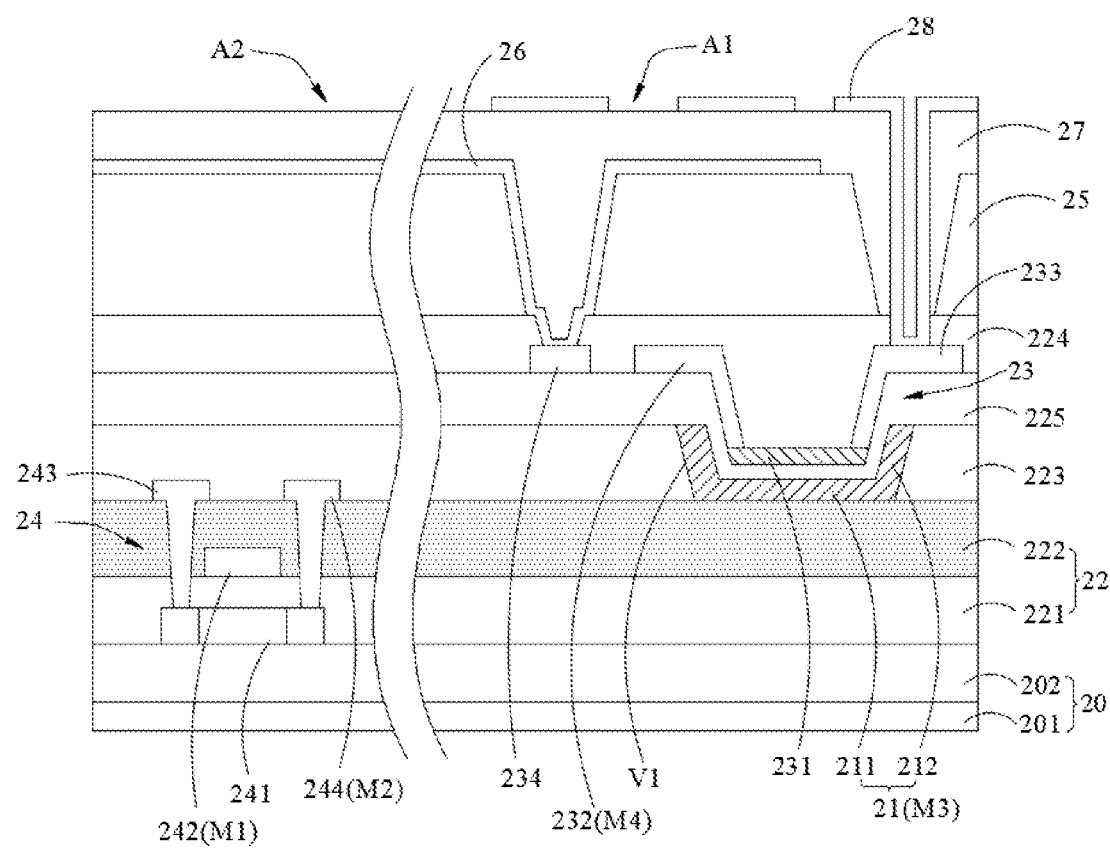
FIG. 7 is a cross-sectional view of an array substrate of a fourth embodiment of the present disclosure along an A-A' line.

In embodiments, as shown in FIG. 3 to FIG. 7, where FIG. 5 is a cross-sectional view of an array substrate of a second embodiment of the present disclosure along an A-A' line, FIG. 6 is a cross-sectional view of an array substrate of a third embodiment of the present disclosure along an A-A' line, and FIG. 7 is a cross-sectional view of an array substrate of a fourth embodiment of the present disclosure along an A-A' line. The array substrates further include a plurality of second thin film transistors 24. An active layer of the second thin film transistor 24 is a polysilicon semiconductor layer 241. Each of the array substrates includes a light transmitting region A1 and a non-light transmitting region A2 surrounding the light transmitting region A1. The first thin film transistors 23 are arranged in the light transmitting region A1. The second thin film transistors 24 are arranged in the non-light transmitting region A2.

It should be noted that the light transmitting region A1 of the array substrate corresponds to a display area of a display panel, and the non-light transmitting region A2 corresponds to a non-display area of the display panel. A gate driver on array (GOA) is provided in the non-display area A2 on at least one side of the display area A1. The second thin film transistors 24 are used in the GOA circuits. The second thin film transistors 24 are low temperature polysilicon thin film transistors, which have advantages of high carrier mobility, fast charging, fast switching speed, and low power consumption. The second thin film transistors 24 are used in the GOA circuits, which can effectively improve a response speed of the GOA circuits and reduce a power consumption of the array substrate. The first thin film transistors 23 are arranged in the display area A2 and are used in sub-pixel driving circuits. The first thin film transistors 23 are oxide thin film transistors, which has advantages of good uniformity and low leakage current, which can further reduce the power consumption of the array substrate.

Furthermore, the first insulating layer 22 includes a first gate insulating layer 221 and an interlayer dielectric layer 222 disposed on the base substrate 20 in a layer-by-layer-like manner The second thin film transistor 24 also include a gate 242. The polysilicon semiconductor layer 241 is disposed between the first gate insulating layer 221 and the base substrate 20. The gate 242 is disposed between the first gate insulating layer 221 and the interlayer dielectric layer 222.

The plurality of via holes V1 are formed on the interlayer dielectric layer 222. Bottoms of the via holes V1 extend toward the base substrate 20. The second insulating layer 223 covers the interlayer insulating dielectric layer 222 and the light-shielding patterns 21.

Specifically, the interlayer dielectric layer 222 is a stacked structure formed of silicon nitride and silicon oxide materials. A silicon nitride film layer is disposed between a silicon oxide film layer and the first gate insulating layer 221. The silicon nitride film layer contains more hydrogen. The silicon oxide film layer is configured to separate the silicon nitride film layer from the oxide semiconductor layer 231 to prevent hydrogen in the silicon nitride film layer from diffusing into the oxide semiconductor layer 231.

In one embodiment, as shown in FIG. 5, the bottom light-shielding layer 211 of the light-shielding pattern 21 is disposed on a surface of the base substrate 20 close to the first gate insulating layer 221. The side light-shielding layer 212 is formed by extending an edge of the bottom light-shielding layer 211 along a direction from the base substrate 20 to the interlayer dielectric layer 222. The top of the side light-shielding layer 212 is flush with the surface of the interlayer dielectric layer 222 away from the base substrate 20. The distance between the oxide semiconductor layer 231 and the bottom light-shielding layer 211 is less than the distance between the top of the side light-shielding layer 212 and the bottom light-shielding layer 211. The recess-shaped light-shielding pattern 21 half-encloses the oxide semiconductor layer 231, and limits the interlayer dielectric layer 222 to a periphery of the light-shielding pattern 21. When the oxide semiconductor layer 231 is formed, hydrogen in the interlayer dielectric layer 222 can be prevented from diffusing to the oxide semiconductor layer 231, thereby ensuring electrical performance of the oxide semiconductor layer 231 and improving stability of the first thin film transistor 23.

Furthermore, the second thin film transistor 24 includes a second source 243 and a second drain 244. The light-shielding patterns 21, the second source 243 and the second drain 244 are made of a metal material in a same layer.

As shown on FIG. 5, the second source 243 and the second drain 244 are disposed on a surface of the interlayer dielectric layer 222 away from the first gate insulating layer 221. The light-shielding patterns 21 are arranged in the via holes V1 formed on the interlayer dielectric layer 222.

It is understandable that before forming the light-shielding patterns 21, the second source 243, and the second drain 244, the plurality of via holes V1 extending through the interlayer dielectric layer 222 and the first gate insulating layer 221 may be formed simultaneously by one etching process. Each of the plurality of via hole V1 exposes a source contact area and a drain contact area of the polysilicon semiconductor layer 241 and a surface of the base substrate 20 close to the first gate insulating layer 221. The recess-shaped light-shielding patterns 21 are formed in the via holes V1 that expose the surface of the base substrate 20. The gate 242 is formed by patterning a first metal layer M1. The light-shielding patterns 21, the second source 243, and the second drain 244 are formed by patterning a second metal layer M2. The first source 232, the first drain 233, a touch signal line 234, and a signal line 235 are arranged in the same layer as the first source 232, and are formed by patterning a third metal layer M3.

Specifically, the second metal layer M2 is a metal stacked wiring structure made of Mo, Al, and Ti. Materials and structures of the first metal layer M1, the third metal layer M3, and the second metal layer M2 are the same. In some other embodiments, the second metal layer M2 may also be a metal wiring structure made of any one of Mo, Al, Ti, or other materials. Alternatively, material of the second metal layer M2 can also be an alloy formed by two or more of Mo, Al, and Ti. The materials and the structures of the first metal layer M1, the second metal layer M2, and the third metal layer M3 may be the same or different. The materials and the structures of the first metal layer M1, the second metal layer M2, and the third metal layer M3 can be set according to actual conditions, and there is no limitation here.

In one embodiment, as shown in FIG. 6, the first source 232, the first drain 233, the second source 243, and the second drain 244 are made a metal material on the same layer. The gate 242 is formed by patterning the first metal layer M1. The light-shielding patterns 21 are formed by patterning the second metal layer M2. The first source 232, the first drain 233, the second source 243, the second drain 244, and the touch signal line 234 are arranged in the same layer as the first source 232, and are formed by patterning the third metal layer M3.

It should be noted that the light-shielding patterns 21, the second source 243, and the second drain 244 are made of metal materials on different layers. A depth of via hole V1 where light-shielding pattern 21 is located can be set according to requirements. As shown in FIG. 6, the bottom of the via hole V1 only extends through the interlayer dielectric layer 222, and exposes a surface of the first gate insulating layer 221 away from the base substrate 20. The bottom light-shielding layer 211 is formed on the surface of the first gate insulating layer 221 away from the base substrate 20. The side light-shielding layer 212 extends from the edge of the bottom light-shielding layer 211 to the surface of the interlayer dielectric layer 222 away from the base substrate 20 and is flush with the surface. In some other embodiments, as shown in FIG. 4, the bottom of the via hole V1 where the light-shielding pattern 21 is located extends through the interlayer dielectric layer 222 and the first gate insulating layer 221. Alternatively, the bottom of the via hole V1 may also be disposed in the interlayer dielectric layer 22 and does not extend through the interlayer dielectric layer 222. Alternatively, the bottom of the via holes V1 may also be located in the first gate insulating layer 221, and does not penetrate the first gate insulating layer 221. The depth of via hole V1 where light-shielding pattern 21 is located can be set according to actual needs, and there is no limitation here.

In some embodiments, as shown in FIG. 7, the light-shielding patterns 21 and the second source 243 are made of metal materials on different layers, and the second source 243 and the first source 232 are made of metal materials on different layers.

Specifically, the gate 242 is formed by patterning the first metal layer M1. The second source 243 and the second drain 244 are formed by patterning the second metal layer M2. The array substrate also includes a third insulating layer 225. The third insulating layer 225 is disposed on a surface of the second insulating layer 223 away from the base substrate 20. The second source 243 and the second drain 244 are disposed on the interlayer dielectric layer 222. The via holes V1 are formed on the second insulating layer 223. The first source 232 and the first drain 233 are disposed on the third insulating layer 225. It can be understood that after the second insulating layer 223 is formed, the plurality of via holes V1 are formed by etching the second insulating layer 223. Then, the third metal insulating layer M3 is deposited on the second layer 223, and the light-shielding patterns 21 are formed through a patterning process. The first source 232, the first drain 233, and the touch signal line 234 arranged on the same layer as the first source 232 are formed by patterning a fourth metal layer M4. The fourth metal layer M4 is formed on a surface of the third insulating layer 225 away from the base substrate 20. Material and structure of the fourth metal layer M4 may be the same as the material and structure of the above metal layer, and will not be repeated here.

In some embodiments, as shown in FIG. 4 to FIG. 7, the array substrate further includes a passivation protection layer 224, a planarization layer 25, a touch electrode layer 26, a second passivation protection layer 27, and a pixel electrode layer 28 which are disposed on the second insulating layer 223 or the third insulating layer 225. Touch electrodes in the touch electrode layer 26 are connected to the touch signal line 235 through via holes. Sub-pixel electrodes in the pixel electrode layer 28 are connected to the first drains 233 of the first thin film transistors 23 through via holes.

In one embodiment, material of the oxide semiconductor layer 231 is preferably IGZO. Also, in other embodiments, the material of the oxide semiconductor layer 231 may also include, but not limited to, oxide semiconductor materials such as indium gallium oxide or indium zinc oxide. Specific materials can be selected according to actual needs, and there is no restriction here.

Accordingly, the embodiments of the present disclosure provide the array substrate. The array substrate includes the plurality of thin film transistors arranged in an array. At least part of thin film transistors in the plurality of the thin film transistors each includes the oxide semiconductor layer. The array substrate includes the plurality of recess-shaped light-shielding patterns. The oxide semiconductor layer is correspondingly formed in a recess of one of the light-shielding patterns. A bottom surface of the recess-shaped light-shielding pattern can block light irradiated from a light incident side of the array substrate to a bottom of the oxide semiconductor layer. A side surface of the recess-shaped light-shielding pattern can block light irradiated from the light incident side of the array substrate to a side surface of the oxide semiconductor layer. Thus, light-shielding performance of the light-shielding patterns can be improved by setting the light-shielding patterns as the recess shape. In comparison with increasing a plane area for improving light-shielding performance of the light-shielding patterns, an area of an orthographic projection of the recess-shaped light-shielding patterns on the array substrate is smaller. Therefore, an area of a light-transmitting region of the array substrate is greater, thereby increasing an aperture of the array substrate.

An embodiment of the present disclosure also provides a display panel. The display panel includes an array substrate, a color filter substrate, a liquid crystal layer, and a backlight module. The array substrate is disposed opposite to the color filter substrate. The liquid crystal layer is disposed between the array substrate and the color filter substrate. The backlight module is disposed on a light incident side of the array substrate. The array substrate in the embodiment of the present disclosure may be the array substrate provided in the foregoing embodiments. In addition, the array substrate is applied to the display panel of the embodiment of the present disclosure, and the array substrate can achieve the same technical effect as the array substrate of the foregoing embodiments, which will not be repeated here.

Figure 8:
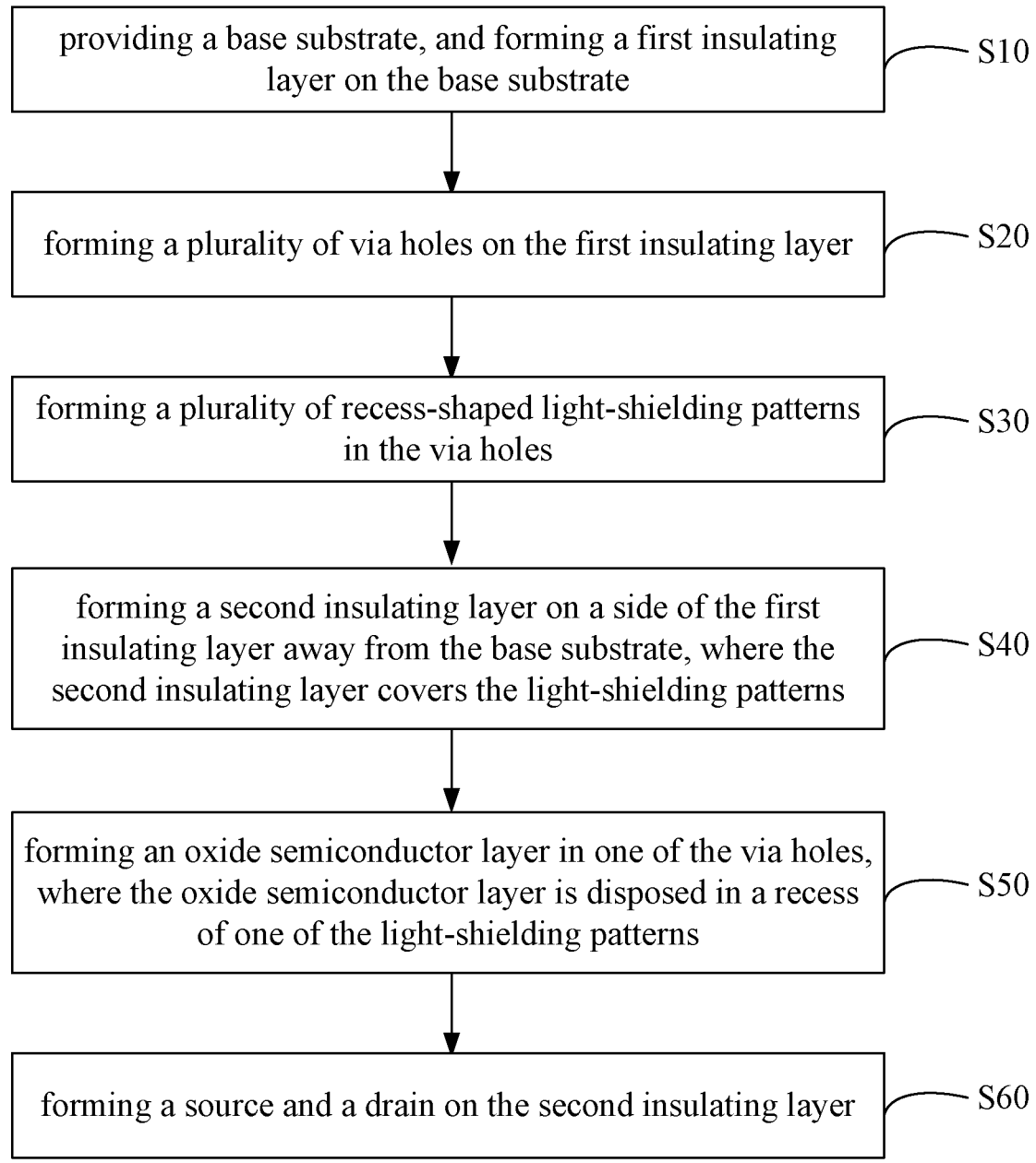
FIG. 8 is a flowchart of a manufacturing method of an array substrate of an embodiment of the present disclosure.

An embodiment of the present disclosure also provides a manufacturing method of an array substrate, which will be described in detail below with reference to FIG. 8 to FIG. 9H. FIG. 8 is a flowchart of a manufacturing method of an array substrate of an embodiment of the present disclosure. FIG. 9A to FIG. 9H are schematic diagrams showing the array substrate of the present disclosure in manufacturing processes. The manufacturing method of the array substrate includes the following steps.

In a step S10, a base substrate 30 is provided, and a first insulating layer 32 is formed on the base substrate.

Figure 9A:
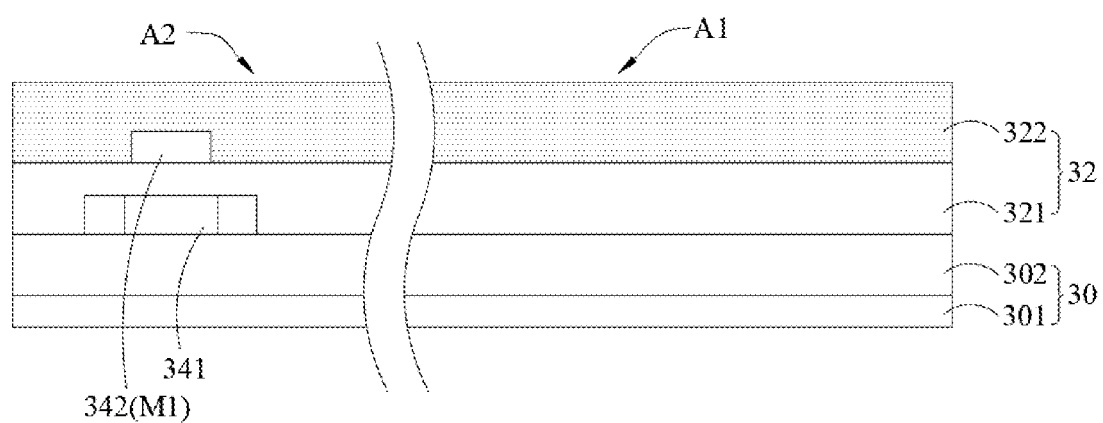
FIG. 9A to FIG. 9H are schematic diagrams showing the array substrate of the present disclosure in manufacturing processes.

In an embodiment, as shown in FIG. 9A, the base substrate 30 is composed of a substrate 301 and a buffer layer 302 that are stacked. The substrate 301 is preferably a glass substrate. The first insulating layer 32 includes a first gate insulating layer 321 and an interlayer dielectric layer 322 which are stacked on the base substrate 30. The step S10 includes the following steps.

In a step S101, the base substrate 30 is provided, and a polysilicon semiconductor layer 341 is formed on the base substrate 30.

In a step S102, the first gate insulating layer 321 is formed on the base substrate 30, and the first gate insulating layer 321 covers the polysilicon semiconductor layer 341.

In a step S103, a first metal layer M1 is deposited on a surface of the first gate insulating layer 321 away from the base substrate 30, and a patterning process is performed on the first metal layer M1 to form a gate 342.

In a step S104, an interlayer dielectric layer 322 is formed on the surface of the first gate insulating layer 321 away from the base substrate 30. The interlayer dielectric layer 322 covers the gate 342.

In the embodiment of the present disclosure, the polysilicon semiconductor layer 341 and the gate 342 are formed in a non-light transmitting region A2 of the array substrate. The non-light transmitting region A2 of the array substrate corresponds to a non-display region of a display panel.

Specifically, in the step S103, the first metal layer M1 is a metal stacked wiring structure made of Mo, Al, and Ti. In some other embodiments, the first metal layer M1 may also be a metal wiring structure made of any one of Mo, Al, or Ti. Alternatively, the material of the first metal layer M1 may also be an alloy formed by two or more materials among Mo, Al, or Ti. The material and structure of the first metal layer M1 can be set according to actual conditions, and there is no limitation here.

In a step S20, a plurality of via holes are formed on the first insulating layer 32.

Figure 9B:
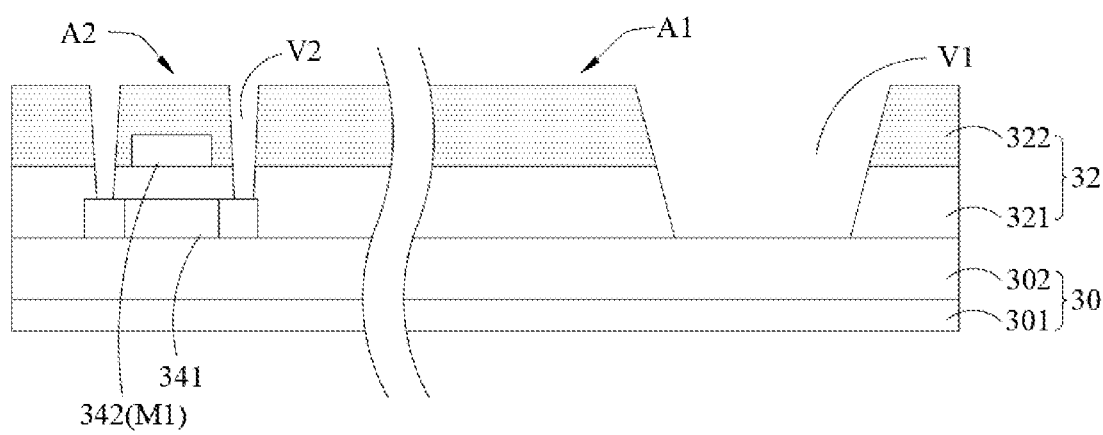

In an embodiment, as shown in FIG. 9B, the plurality of via holes include a first via hole V1 and a second via hole V2. The first via hole V1 and the second via hole V2 can be formed simultaneously by a same etching process. The first via hole V1 extends through the interlayer dielectric layer 322 and the first gate insulating layer 321, and exposes a surface of the base substrate 30 close to the first gate insulating layer 321. The second via hole V2 exposes a source contact area and a drain contact area of the polysilicon semiconductor layer 341.

In some other embodiments, a bottom of the first via hole V1 may only extend through the interlayer dielectric layer 322. Alternatively, the bottom of the first via hole V1 may extend into the interlayer dielectric layer 322, but does not extend through the interlayer dielectric layer 322. Alternatively, the bottom of the first via hole V1 may extend into the first gate insulating layer 321, and only extend through the interlayer dielectric layer 322, but not extend through the first gate insulating layer 321.

In a step S30, a plurality of recess-shaped light-shielding patterns 31 disposed in the via holes.

In some embodiments, the step S30 includes the following steps.

In a step S301, on the surface of the first gate insulating layer 321 away from the base substrate 30, a second metal layer M2 is deposited in the first via hole V1 and the first via hole V2.

In a step S302, a patterning process is performed on the second metal layer M2 to form a second source 343, a second drain 344, and the recess-shaped light-shielding patterns 31.

Figure 9C:
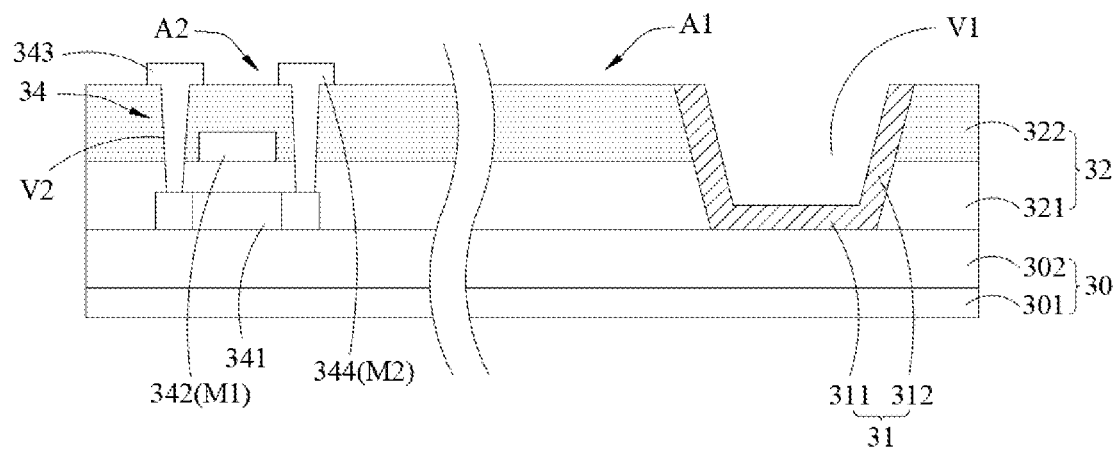

As shown in FIG. 9C, each of the light-shielding patterns 31 includes a bottom light-shielding layer 311 and a side light-shielding layer 312. A surface of the side light-shielding layer 312 extending from an edge of the bottom light-shielding layer 311 to the interlayer dielectric layer 322 away from the base substrate 30 is flush, so as to limit the interlayer dielectric layer 322 to a periphery of the recess-shaped light-shielding pattern 31.

The second source 343, the second drain 344, the gate 342, and the polysilicon semiconductor layer 341 together form a second thin film transistor 34. The second thin film transistor 34 is a low temperature polysilicon thin film transistor, which has advantages of high carrier mobility, fast charging, fast switching speed, and low power consumption. The second thin film transistor 34 is applied to a GOA circuit of the non-light transmitting region A2, which can effectively improve a response speed of the GOA circuit and reduce a power consumption of the array substrate.

Specifically, the second metal layer M2 is a metal stacked wiring structure made of Mo, Al, and Ti. In some other embodiments, the second metal layer M2 may also be a metal wiring structure made of any one of Mo, Al, or Ti. Alternatively, the material of the second metal layer M2 may also be an alloy formed by two or more materials among Mo, Al, or Ti. The material and structure of the second metal layer M2 can be set according to actual conditions, and there is no limitation here.

In a step S40, a second insulating layer 323 is disposed on a surface of the first insulating layer 32 away from the base substrate 30. The second insulating layer 323 covers the light-shielding patterns 31.

Figure 9D:
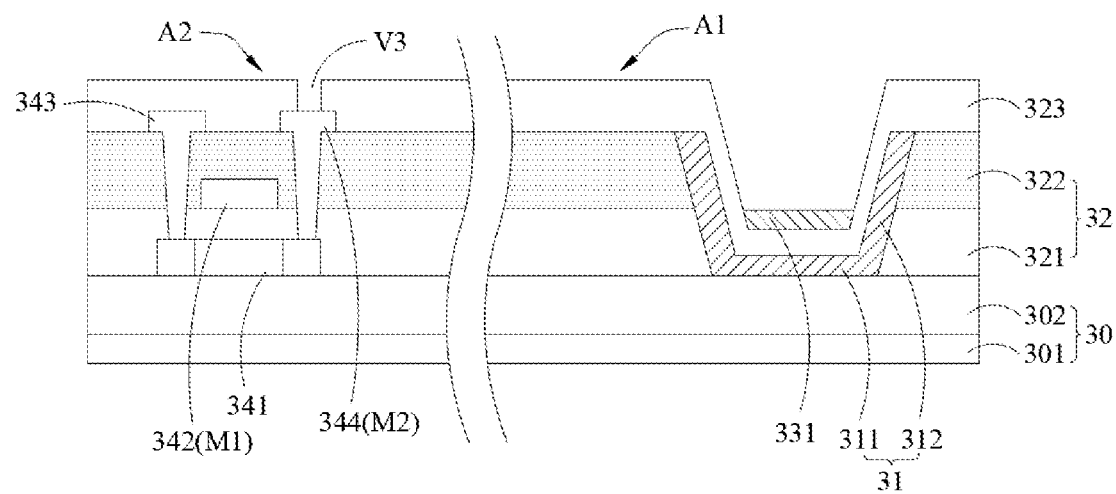

As shown in FIG. 9D, in the step S40, the second insulating layer 323 may be formed by a vapor deposition method. The second insulating layer 323 is made of an inorganic material, preferably a silicon oxide material. A portion of the second insulating layer 323 covering the light-shielding pattern 31 is also recessed into the first via hole V1, so that a height of the portion of the second insulating layer 323 covering the light-shielding patterns 31 is lower than a height of other portions.

The step S40 further includes a step of forming a plurality of third via holes V3 on the second insulating layer 323 by an etching process. The third via hole V3 exposes the second drain 344.

In a step S50, an oxide semiconductor layer 331 is disposed in the via hole. The oxide semiconductor layer 331 is disposed in a recess of the light-shielding pattern 31.

The step S50 includes the following steps:

In a step S501, a layer of metal oxide material is deposited on a surface of the second insulating layer 323 away from the base substrate 30.

In a step S502, a patterning process is performed on the metal oxide material to form the oxide semiconductor layer 331.

As shown in FIG. 9D, the oxide semiconductor layer 331 is disposed in the first via hole V1. A distance between a surface of the oxide semiconductor layer 331 away from the base substrate 30 and the bottom light-shielding layer 311 is less than a distance between a top of the side light-shielding layer 312 and the bottom light-shielding layer 311. In this way, the recess-shaped light-shielding pattern 31 forms a half-enclosed structure for the oxide semiconductor layer 331, so as to separate the interlayer dielectric layer 322 from the oxide semiconductor layer 331. Thus, hydrogen in the interlayer dielectric layer 322 is prevented from diffusing into the oxide semiconductor layer 331, and light is also prevented from being irradiated into the oxide semiconductor layer 331 from the bottom and sides of the oxide semiconductor layer 331.

Specifically, material of the oxide semiconductor layer 331 is IGZO. Moreover, in some other embodiments, the material of the oxide semiconductor layer 331 may also include but not limited to oxide semiconductor materials such as indium gallium oxide or indium zinc oxide. Specific materials can be selected according to actual needs, and there is no limited here.

In a step S60, a source and a drain are formed on the second insulating layer 323.

Figure 9E:
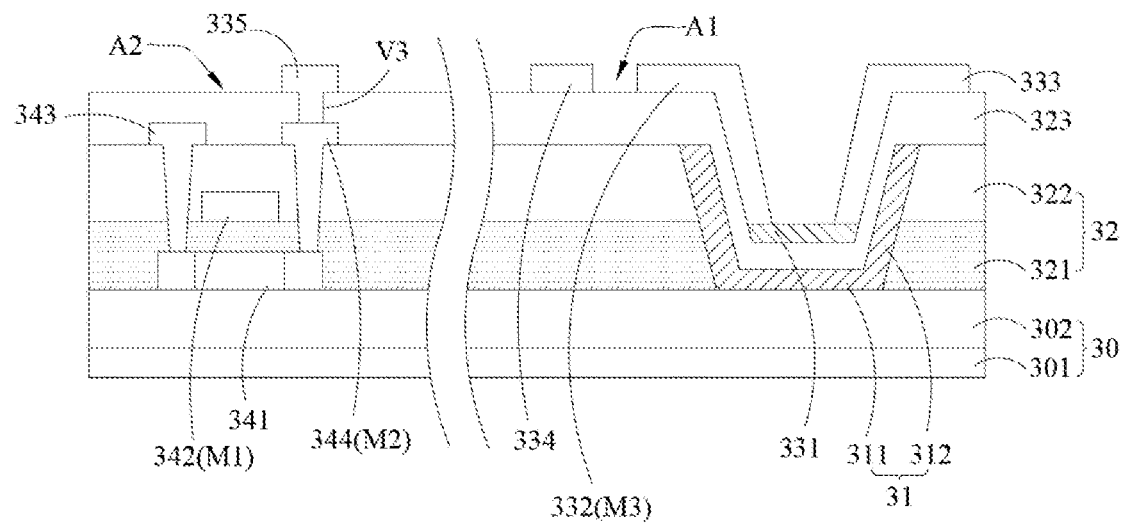

As shown in FIG. 9E, the source and the drain referred to in the step S50 are a first source 332 and a first drain 333 in FIG. 9E, respectively. The step S50 includes the following steps.

In a step S501, a third metal layer M3 is deposited on a surface of the second insulating layer 323 away from the base substrate 30 and in the third via hole V3.

In a step S502, a patterning process is performed on the third metal layer M3 to form the first source 332, the first drain 333, a touch signal line 334, and a signal line 335.

In this embodiment, the first source 332, the first drain 333, the oxide semiconductor layer 331, and the light-shielding pattern 31 together form a first thin film transistor 33. The light-shielding pattern 31 serves as a gate of the first thin film transistor 33. The first thin film transistor 33 is disposed in a light transmitting region of the array substrate and applied to a sub-pixel driving circuit in the light transmitting region. The first thin film transistor 33 is an oxide thin film transistor, which has characteristics of good uniformity and low leakage current, thereby further reducing power consumption of the array substrate.

In this embodiment, material and a structure of the third metal layer M3 and that of the second metal layer M2 are the same. In some other embodiments, the third metal layer M3 may also be a metal wiring structure formed by any one of Mo, Al, Ti, or other materials. Alternatively, the material of the third metal layer M3 can also be an alloy formed by two or more of Mo, Al, or Ti. The material and the structure of the third metal layer M3 can be set according to actual conditions, and there is no limited here.

In a step S70, a first passivation protection layer 324 is formed on a surface of the second insulating layer 323 away from the base substrate 30. A plurality of fourth via holes V4 and fifth via holes V5 are formed on the first passivation protection layer 324 through an etching process. One of the plurality of fourth via holes V4 exposes the touch signal line 334. One of the plurality of fifth via holes V5 exposes the first drain 333.

Figure 9F:
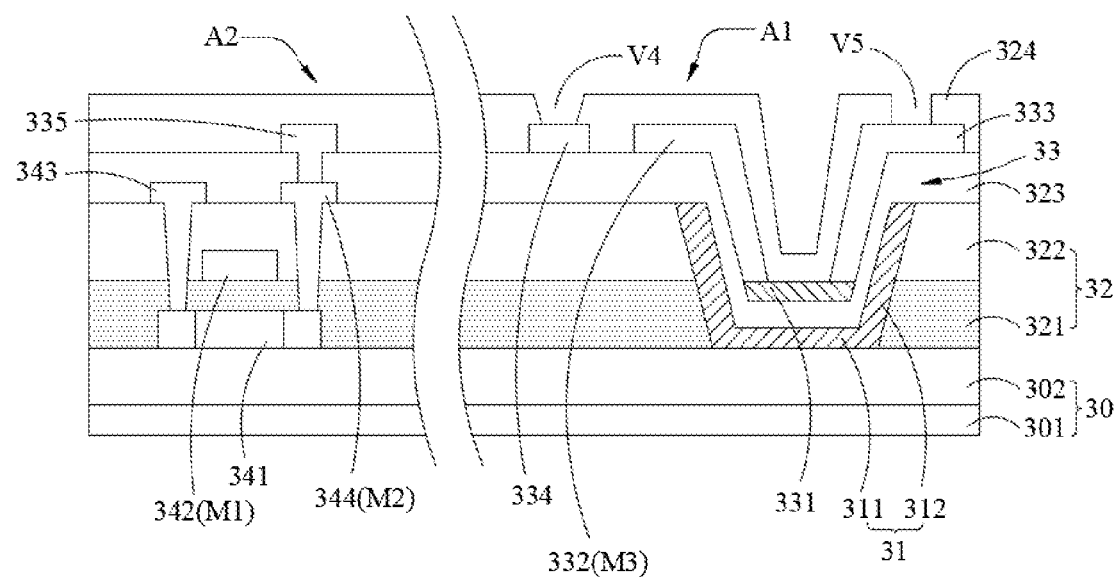

As shown in FIG. 9F, the first passivation protection layer 324 is formed on a surface of the second insulating layer 323 away from the base substrate 30. The first passivation protection layer 324 covers the touch signal line 334, the signal line 335, the first source 332, the first drain 333, and the oxide semiconductor layer 331.

In one embodiment, in order to prevent the first passivation protection layer 324 from being etched during the etching process, a thickness of the first passivation protection layer 324 should be 600 nm. Alternatively, in some other embodiments, the thickness of the first passivation protection layer 324 may also be 300 nm, 500 nm, 800 nm, or 100 nm. The thickness of the first passivation protection layer 324 can be set according to actual conditions, and is not limited here.

In a step S80, a planarization layer 35 is formed on a surface of the first passivation protection layer 324 away from the base substrate 30. A plurality of sixth via holes V6 and a plurality of seventh via holes V7 are formed on the planarization layer 35 through an etching process. One of the plurality of sixth via holes V6 exposes the touch signal line 334, and one of the seventh via holes V7 exposes the first drain 333.

Figure 9G:
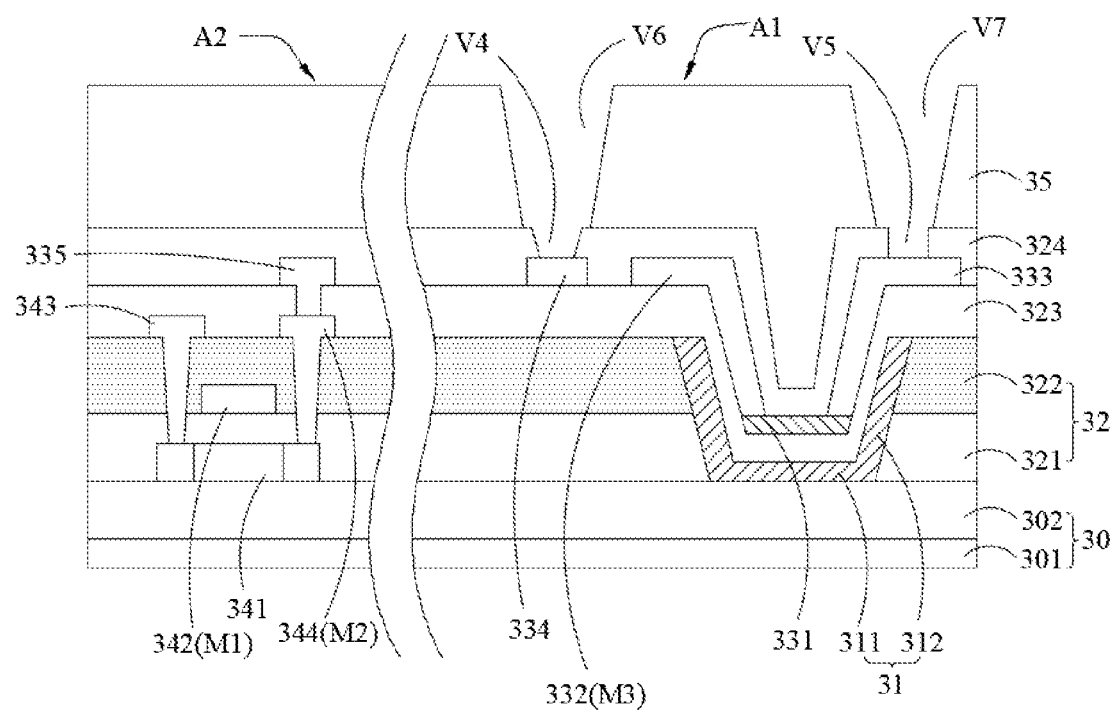
Figure 9H:
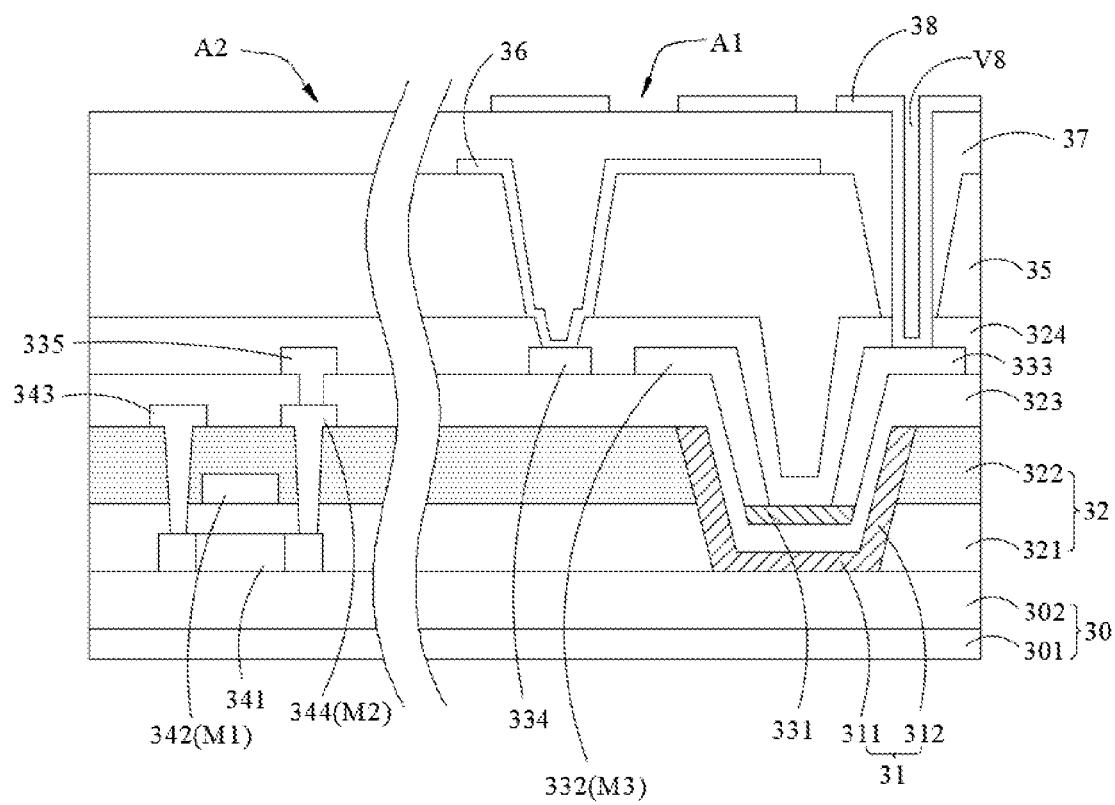

As shown in FIG. 9G, the fourth via hole V4 is connected to the sixth via hole V6. The fifth via hole V5 is connected to the seventh via hole V7.

Material of the planarization layer 35 is a commonly used photoresist material. Before being cured, the planarization layer 35 fills the first via hole V1 with its fluidity.

In a step S90, a touch electrode layer 36 is formed on a surface of the planarization layer 35 away from the base substrate 30, and then a second passivation protection layer 37 is formed on a surface of the planarization layer away from the base substrate 30. A plurality of eighth via holes V8 are formed on the second passivation protection layer 37 through an etching process. A pixel electrode layer 38 is formed on a surface of the second passivation protection layer 37 away from the base substrate 30.

As shown in FIG. 9G and FIG. 9H, the touch electrode layer 36 includes a plurality of touch electrodes. The touch electrode is connected to the touch signal line 335 through the sixth via holes V6 and the fourth via holes V4.

One of the eighth via hole V8 exposes the first drain 334. The pixel electrode layer 38 includes a plurality of sub-pixel electrodes. The sub-pixel electrode is connected to the first drain 334 through the eighth via hole V8.

In the embodiment of the present disclosure, material of the pixel electrode layer 38 and that of the touch electrode layer 36 are both ITO. In some other embodiments, the material of the pixel electrode layer 38 and that of the touch electrode layer 36 may also be other transparent metal oxide materials. The material of the pixel electrode layer 38 and that of the touch electrode layer 36 may be the same or different. The material of the pixel electrode layer 38 and that of the touch electrode layer 36 can be set according to actual conditions, and there is no limitation here.

Accordingly, the embodiment of the present disclosure provides the manufacturing method of the array substrate. The manufacturing method includes: forming the plurality of via holes on the first insulating layer, and forming the recess-shaped light-shielding patterns in the via holes. A bottom surface of the recess-shaped light-shielding pattern can block light irradiated from a light incident side of the array substrate to a bottom of the oxide semiconductor layer. A side surface of the recess-shaped light-shielding pattern can block light irradiated from the light incident side of the array substrate to a side surface of the oxide semiconductor layer. Thus, light-shielding performance of the light-shielding patterns can be improved by setting the light-shielding patterns as the recess shape. In comparison with increasing a plane area for improving light-shielding performance of the light-shielding patterns, an area of an orthographic projection of the recess-shaped light-shielding patterns on the array substrate is smaller. Therefore, an area of a light-transmitting region of the array substrate is greater, thereby increasing an aperture of the array substrate. Also, the light-shielding pattern separate the interlayer dielectric layer from the oxide semiconductor layer to prevent hydrogen in the interlayer dielectric layer from diffusing into the oxide semiconductor layer, thereby ensuring the electrical performance of the oxide semiconductor layer.

In summary, although the present disclosure is disclosed as above in the preferred embodiments, the above preferred embodiments are not intended to limit the present disclosure. Those of ordinary skill in the art can make various changes and modifications without departing from the spirit and scope of the present disclosure. Therefore, the protection scope of the present disclosure is based on the scope defined by the claims.

What is claimed is:

1. An array substrate, comprising:
a plurality of first thin film transistors and second thin film transistors arranged in an array, wherein the first thin film transistors are arranged in a light transmitting region of the array substrate, the second thin film transistors are arranged in a non-light transmitting region of the array substrate, an active layer of each of the first thin film transistors is an oxide semiconductor layer, an active layer of each of the second thin film transistors is a polysilicon semiconductor layer, each of the second thin film transistors comprises a second source and a second drain;
a base substrate;
a first insulating layer disposed on the base substrate, the first insulating layer comprises an interlayer dielectric layer disposed on the base substrate;
a second insulating layer;
a plurality of via holes formed on the first insulating layer; and
a plurality of light-shielding patterns in a recess shape disposed in the via holes, wherein the light-shielding patterns, the second source, and the second drain are made of a metal material in a same layer, the second source and the second drain are disposed on a surface of the interlayer dielectric layer away from the base substrate, the oxide semiconductor layer is correspondingly formed in a recess of one of the light-shielding patterns; and
wherein the plurality of the via holes at least extend through the interlayer dielectric layer, and the second insulating layer covers the interlayer dielectric layer and the light-shielding patterns.

2. The array substrate according to claim 1, wherein each of the light-shielding patterns comprises a bottom light-shielding layer and a side light-shielding layer, the bottom light-shielding layer extends flatly and is disposed on a bottom of one of the via holes, the side light-shielding layer is formed by extending the bottom light-shielding layer toward a side of the first insulating layer away from the base substrate, and the side light-shielding layer and the bottom light-shielding layer form an included angle.

3. The array substrate according to claim 2, wherein the included angle formed by the side light-shielding layer and the bottom light-shielding layer is a right angle or an obtuse angle.

4. The array substrate according to claim 3, wherein a degree of the included angle is greater than 90° and less than or equal to 140°.

5. The array substrate according to claim 2, wherein a distance between a top of the side light-shielding layer and the bottom light-shielding layer is greater than a distance between a side of the oxide semiconductor layer away from the base substrate and the bottom light-shielding layer.

6. The array substrate according to claim 5, wherein an orthographic projection of one of the light-shielding patterns on the base substrate covers an orthographic projection of the oxide semiconductor layer on the base substrate.

7. The array substrate according to claim 1, wherein one of the light-shielding patterns is a gate of the first thin film transistor, and the first thin film transistor is formed in one of the via holes.

8. The array substrate according to claim 7, wherein the oxide semiconductor layer is disposed on a portion of the second insulating layer located in one of the via holes; and
wherein the first thin film transistor comprises a first source and a first drain, the first source and the first drain are arranged on a side of the second insulating layer away from the first insulating layer, extend into one of the via holes, and are connected to the oxide semiconductor layer.

9. The array substrate according to claim 8,
wherein the first insulating layer comprises a first gate insulating layer, the polysilicon semiconductor layer is disposed between the first gate insulating layer and the base substrate, and a gate of one of the second thin film transistors is disposed between the first gate insulating layer and the interlayer dielectric layer.

10. The array substrate according to claim 9, wherein the plurality of the via holes extend through the first gate insulating layer.

11. The array substrate according to claim 1, wherein the second source, the second drain, and the first source are made of a metal material in a same layer.

12. A display panel, comprising an array substrate, wherein the array substrate comprises:
a plurality of first thin film transistors and second thin film transistors arranged in an array, wherein the first thin film transistors are arranged in a light transmitting region of the array substrate, the second thin film transistors are arranged in a non-light transmitting region of the array substrate, an active layer of each of the first thin film transistors is an oxide semiconductor layer, an active layer of each of the second thin film transistors is a polysilicon semiconductor layer, each of the second thin film transistors comprises a second source and a second drain;
a base substrate;
a first insulating layer disposed on the base substrate, the first insulating layer comprises an interlayer dielectric layer disposed on the base substrate;
a second insulating layer;
a plurality of via holes formed on the first insulating layer; and
a plurality of light-shielding patterns in a recess shape disposed in the via holes, wherein the light-shielding patterns, the second source, and the second drain are made of a metal material in a same layer, the second source and the second drain are disposed on a surface of the interlayer dielectric layer away from the base substrate, the oxide semiconductor layer is correspondingly formed in a recess of one of the light-shielding patterns; and wherein the plurality of the via holes at least extend through the interlayer dielectric layer, and the second insulating layer covers the interlayer dielectric layer and the light-shielding patterns.

13. The display panel according to claim 12, wherein each of the light-shielding patterns comprises a bottom light-shielding layer and a side light-shielding layer, the bottom light-shielding layer extends flatly and is disposed on a bottom of one of the via holes, the side light-shielding layer is formed by extending the bottom light-shielding layer toward a side of the first insulating layer away from the base substrate, and the side light-shielding layer and the bottom light-shielding layer form an included angle.

14. The display panel according to claim 13, wherein the included angle formed by the side light-shielding layer and the bottom light-shielding layer is a right angle or an obtuse angle.

15. The display panel according to claim 14, wherein a degree of the included angle is greater than 90° and less than or equal to 140°.

16. The display panel according to claim 13, wherein a distance between a top of the side light-shielding layer and the bottom light-shielding layer is greater than a distance between a side of the oxide semiconductor layer away from the base substrate and the bottom light-shielding layer.

17. The display panel according to claim 16, wherein an orthographic projection of one of the light-shielding patterns on the base substrate covers an orthographic projection of the oxide semiconductor layer on the base substrate.

* * * * *